US011905609B2

(12) United States Patent
Smirnova et al.

(10) Patent No.: US 11,905,609 B2
(45) Date of Patent: *Feb. 20, 2024

(54) SELF-ORGANIZED AND ELECTRICALLY CONDUCTING PEDOT POLYMER MATRIX FOR APPLICATIONS IN SENSORS AND ENERGY GENERATION AND STORAGE

(71) Applicant: South Dakota Board of Regents, Pierre, SD (US)

(72) Inventors: Alevtina Smirnova, Rapid City, SD (US); Michael McGraw, Rapid City, SD (US); Praveen Kolla, Rapid City, SD (US)

(73) Assignee: SOUTH DAKOTA BOARD OF REGENTS, Pierre, SD (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/394,711

(22) Filed: Aug. 5, 2021

(65) Prior Publication Data
US 2021/0363649 A1  Nov. 25, 2021

Related U.S. Application Data

(62) Division of application No. 15/439,585, filed on Feb. 22, 2017, now Pat. No. 11,111,586.
(Continued)

(51) Int. Cl.
*C25B 3/00* (2021.01)
*H01M 4/90* (2006.01)
(Continued)

(52) U.S. Cl.
CPC .............. *C25B 3/00* (2013.01); *C08G 61/121* (2013.01); *C08G 61/126* (2013.01);
(Continued)

(58) Field of Classification Search
CPC ....... C25B 3/00; C25B 11/041; C08G 61/126; C08G 2261/1424; C08G 2261/228;
(Continued)

(56) References Cited

U.S. PATENT DOCUMENTS

| 5,035,926 A | 7/1991 | Jonas et al. |
| 7,579,112 B2 | 8/2009 | Chiang et al. |

(Continued)

FOREIGN PATENT DOCUMENTS

| CN | 105074947 A | 11/2015 |
| CN | 103361698 B | 12/2015 |

(Continued)

OTHER PUBLICATIONS

Yin et al.: "Facile Synthesis of Poly(3,4-ethylenedioxythiophene) Film via Solid-State Polymerization as High-Performance Pt-Free Counter Electrodes for Plastic Dye-Sensitized Solar Cells", Applied Materials & Interfaces 2013, 5, pp. 8423-8429.

*Primary Examiner* — Shane Fang
(74) *Attorney, Agent, or Firm* — Goodhue, Coleman & Owens, P.C.

(57) ABSTRACT

The present invention relates to a one-step process for preparation of "in-situ" or "ex-situ" self-organized and electrically conducting polymer nanocomposites using thermally initiated polymerization of a halogenated 3,4-ethylenedioxythiophene monomer or its derivatives. This approach does not require additional polymerization initiators or catalysts, produce gaseous products that are naturally removed without affecting the polymer matrix, and do not leave by-product contaminants. It is demonstrated that self-polymerization of halogenated 3,4-ethylenedioxythiophene monomer is not affected by the presence of a solid-state (Continued)

phase in the form of nanoparticles and results in formation of 3,4-polyethylenedioxythiophene (PEDOT) nanocomposites.

17 Claims, 10 Drawing Sheets

Related U.S. Application Data

(60) Provisional application No. 62/298,517, filed on Feb. 23, 2016.

(51) Int. Cl.
| | | |
|---|---|---|
| H01M 4/60 | (2006.01) | |
| C08G 61/12 | (2006.01) | |
| H01G 11/48 | (2013.01) | |
| H01G 11/86 | (2013.01) | |
| H01G 9/028 | (2006.01) | |
| C25B 11/055 | (2021.01) | |
| H10K 85/10 | (2023.01) | |
| C08L 65/00 | (2006.01) | |
| H10K 71/60 | (2023.01) | |
| H10K 102/00 | (2023.01) | |

(52) U.S. Cl.
CPC ........... $C25B\ 11/055$ (2021.01); $H01G\ 9/028$ (2013.01); $H01G\ 11/48$ (2013.01); $H01G\ 11/86$ (2013.01); $H01M\ 4/608$ (2013.01); $H01M\ 4/9008$ (2013.01); $H10K\ 85/1135$ (2023.02); $C08G\ 2261/1424$ (2013.01); $C08G\ 2261/228$ (2013.01); $C08G\ 2261/3223$ (2013.01); $C08G\ 2261/40$ (2013.01); $C08G\ 2261/512$ (2013.01); $C08G\ 2261/91$ (2013.01); $C08L\ 65/00$ (2013.01); $H10K\ 71/60$ (2023.02); $H10K\ 2102/00$ (2023.02); $Y02E\ 10/549$ (2013.01)

(58) Field of Classification Search
CPC ........ C08G 2261/3223; C08G 2261/44; C08G 2261/91; H01G 11/48; H01G 11/86; H01L 51/0037; H01L 51/0021; H01L 2251/301; H01M 4/608; H01M 4/9008
See application file for complete search history.

(56) References Cited

U.S. PATENT DOCUMENTS

| | | |
|---|---|---|
| 2005/0070654 A1 | 3/2005 | Hsu |
| 2008/0283800 A1 | 11/2008 | Hsu |
| 2009/0310285 A1 | 12/2009 | Reuter et al. |
| 2010/0233538 A1 | 9/2010 | Nesper et al. |
| 2014/0045065 A1 | 2/2014 | Bao et al. |
| 2014/0065400 A1 | 3/2014 | Essiet et al. |
| 2014/0168746 A1 | 6/2014 | Yamamoto et al. |

FOREIGN PATENT DOCUMENTS

| | | |
|---|---|---|
| EP | 1079397 A1 | 2/2001 |
| EP | 2250693 A1 | 11/2010 |
| EP | 2619827 B1 | 2/2015 |
| WO | 2011146835 A2 | 11/2011 |
| WO | 2014026112 A1 | 2/2014 |
| WO | 2014039905 A1 | 3/2014 |
| WO | 2014071830 A1 | 5/2014 |
| WO | 2015025333 A1 | 2/2015 |
| WO | 2015138298 A1 | 9/2015 |

SELF-ORGANIZED AND ELECTRICALLY CONDUCTING PEDOT POLYMER MATRIX FOR APPLICATIONS IN SENSORS AND ENERGY GENERATION AND STORAGE

PRIORITY STATEMENT

This application is a divisional of U.S. utility patent application Ser. No. 15/439,585 filed Feb. 22, 2017, which claims priority to under 35 U.S.C. § 119 to provisional application Ser. No. 62/298,517 filed Feb. 23, 2016, which are hereby incorporated by reference in their entireties.

FIELD OF THE INVENTION

The present invention relates to the synthesis of the PEDOT-based polymer nanocomposites from corresponding halogenated monomers and the resulting advantages for electrochemical or bioelectrochemical energy generation and storage devices. More particularly, but not exclusively, the present invention relates to electrically conducting polymer nanocomposites produced from groups of polythiophenes in a self-polymerization process from a halogenated ethylenedioxythiophene monomer or its derivatives resulting in conjugated poly-3,4-ethylenedioxythiophene (PEDOT) based nanocomposite polymers. The present disclosure is related to 2,5-dibromo-3,4-ethylenedioxythiophene (DBEDOT) monomer or its derivatives.

BACKGROUND

Conductive polymers made from the precursor monomers or a mixture of monomers selected from thiophenes, pyrroles, anilines, and polycyclic aromatics are disclosed in numerous publications and patents (e.g., US 2008/0283800 and WO 2009097654). Among them, the poly-(3,4-ethylenedioxythiophene) (PEDOT) is one of the most promising conductive polymers, that offers several advantages, such as a binder and an electrically conducting phase. Furthermore, the known advantages include high electrical conductivity, electrochromic properties, and optical transparency combined with high chemical and electrochemical stability.

At least three conventional methods of PEDOT polymer synthesis currently exist, among them are the chemical method of oxidative polymerization, electrochemical method, and a heterocyclic coupling reaction of polymerization.

Oxidative polymerization is a conventional method for forming polythiophenes from their monomeric precursors. The polythiophenes produced in the process of oxidative polymerization contain the polyanions that are not electronically conductive, which is a significant disadvantage for energy generation and storage devices. To compensate for the positive charge on the polymer thiophene chain and to stabilize the polymer matrix, the polyanions possess high molecular weights in the range of 2,000-500,000. Thus, the polyanions are considered as a "dead weight" for not being involved in the electronic charge transfer process. Furthermore, the inorganic peroxide compounds although suitable as oxidizing and polymerizing agents (e.g., hydrogen peroxide, sodium perborate, persulfates etc.) are chemically aggressive and often non-compatible with the procedures required for the preparation of the various electrochemically active nanocomposites or nanocoatings. Lastly, the oxidative polymerization of the EDOT (e.g., with FeCl3 in organic solvents) produces an insoluble black polymer powders, that cannot be transposed into a film.

Electropolymerization is another conventional method that has many disadvantages. EDOT monomer electropolymerization is generally performed in an organic media because of the low solubility of the thiophene-based monomers in water, high oxidation potentials of thiophenes (higher than that of water), and water-catalyzed formation of thienyl cation radicals. Electropolymerization in the organic solvents is a time-consuming and complicated approach which is not suitable for many industrial applications. Electrochemical polymerization of 3,4-ethylenedioxythiophene (EDOT) in sodium poly(styrene-4-sulfonate) (NaPSS) aqueous solution can produce electrode-supported and freestanding films of electroactive PEDOT; however, the amount of monomer left after the reaction is complete makes this method problematic for industrial applications.

A PEDOT polymer can be used in combination with polystyrene sulfonate (PSS) forming a polymer mixture of two ionomers poly(3,4-ethylenedioxythiophene) and polystyrene sulfonate (PEDOT:PSS). Instead of polystyrene sulfonate polyanion, other anions (e.g. tetramethacrylate (TMA), para-toluenesulfonate (PTS), etc.) can be used in combination with PEDOT forming, for example PEDOT:TMA and PEDOT:PTS. However, these charged macromolecules in which positive charge on PEDOT compensates for the negative charge on the polymer anion require multiple process steps and cannot be formed in the disclosed one-step polymerization process.

In the PEDOT:PSS polymer mixture, the nature of the electronic conductivity is based on the transport of the charge carriers along the PEDOT conjugated chains. However, in electrochemical devices diethylene glycol impedes the electrode performance due to the chemical decomposition and dissolution.

Additionally, PEDOT:PSS polymer mixtures applied to the substrate surface as a dispersion of PEDOT:PSS macromolecules in water do not have an ability for the "in-situ" self-polymerization, since it is already polymerized.

Since the nature of the PEDOT:PSS mixture is polymeric, the "in-situ" polymerization on the surface of the working electrode cannot be performed. Thus, application of PEDOT:PSS results in an inhomogeneous distribution of the phases at nanoscale, less adhesion between the polymer matrix and the electrode active material, and higher contact resistance at the interface between them.

To increase the electronic conductivity, carbon is commonly added to the electrode nanocomposites; however, electrically conducting polymers, such as PEDOT:PSS are conventionally known, but their deposition on the electrode substrate consists of either multiple steps or cannot be performed in one-step "in-situ" polymerization.

Although conventional practices disclose a heterocyclic coupling reaction of halogenated polythiophenes, they fail to disclose validation of the polymerization processes in presence of the solid state nanoparticles that do not affect the process of the heterocyclic coupling.

Therefore, what is needed is "in-situ" formation of a polymer nanocomposite from halogenated thiophene monomers as a one-step polymerization process. In the present invention, the properties of the nanocomposites produced from HEDOT monomer, specifically DBEDOT (FIG. 1), for preparation of the polymer-based nanocomposites in a one-step process are demonstrated for the first time.

SUMMARY

Therefore, it is a primary object, feature, or advantage of the present invention to improve over the state of the art.

It is a further object, feature, or advantage of the present invention to provide a method for a one-step "in-situ" or "ex-situ" polymerization processes for making an electrically conductive polymer nanocomposites using a halogenated 3,4-ethylenedioxythiophene monomer (EDOT), specifically brominated 3,4-ethylenedioxythiophene monomer, and more specifically 2,5-dibromo-3,4-ethylenedioxythiophene (DBEDOT) monomer or its derivatives.

It is a still further object, feature, or advantage of the present invention to provide a method having at least a step where the halogenated 3,4-ethylenedioxythiophene monomer, specifically DBEDOT or its derivatives is mixed with a polar aprotic solvent, for example acetonitrile (forming a homogeneous solution) and a solid-state phase, and more specifically powders composed of, but not limited to metals, metal alloys, non-metals, metal oxides, ceramics, semiconductors, zeolites, or biologically active nanomaterials.

Another object, feature, or advantage is to provide a method with at least a step where the halogenated 3,4-ethylenedioxythiophene monomer, specifically DBEDOT or its derivatives, is mixed with a solid-state phase, specifically solid-state nanoparticles forming a nanocomposite in which the weight ratio between the polymer and the solid-state phase is in the range of 90 wt. %-10 wt. % to 10 wt. %-90 wt. %, and more preferably 50 wt. %-50 wt. %.

Yet another object, feature, or advantage is to provide a method with at least a step where the brominated EDOT monomer or its derivatives mixed with organic solvent and solid-state nanopowder are heated in the temperature range of 50-90° C., and preferably at 70-80° C., in vacuum to form electrically conductive and optically transparent PEDOT-based nanocomposite films.

It is a further object, feature, or advantage of the present invention to provide a method with at least a step wherein the brominated EDOT monomer or its derivatives are heated in presence of solid-state nanoparticles in the temperature range of 50-90° C. at ambient conditions for a period of time ranging from 12 to 48 h to form PEDOT-based nanocomposites.

It is a still further object, feature, or advantage of the present invention to provide a method with at least one step wherein the mixture of the halogenated EDOT monomer or its derivatives in the presence of an organic solvent and in solid-state phase is deposited on the current collector, metallic substrate, another nanocomposite layer, or flexible polymer layer to form an electrically conductive and optically transparent PEDOT-based nanocomposite polymer film.

Another object, feature, or advantage is to provide a method with at least one step wherein the nanocomposite is deposited on a metallic substrate, current collector, other than the nanocomposite layer, or a flexible polymer layer to form an electrically conductive and optically transparent PEDOT-based nanocomposite film in the "in-situ" process without adding catalysts or initiators.

Yet another object, feature, or advantage is to provide a method with at least one step wherein the nanocomposite is deposited on a metallic substrate, current collector, nanocomposite layer, or flexible polymer layer to form an electrically conductive and optically transparent PEDOT-based nanocomposite polymer film in the "in-situ" process without steps for removal of the reaction by-products.

It is a further object, feature, or advantage of the present invention to provide a method with at least one step wherein the nanocomposite possesses high adhesion to the substrate and a uniform coating when deposited on a metal support, current collector, nanocomposite layer, or on the top of a flexible polymer layer.

Another object, feature, or advantage is to provide a method that eliminates the disadvantage associated with poor solubility of EDOT monomer in water by using thermally initiated HEDOT self-polymerization.

Yet another object, feature, or advantage is to provide a method that eliminates the disadvantages associated with the currently known and broadly used chemical or electrochemical methods of the PEDOT synthesis and nanocomposite preparation that involve presence of high molecular weight organic acids forming PEDOT-polyanion poymer mixtures (e.g., with a negatively charged counter polyanion such as PSS, TMA, or PTS) that initiate the aging process of the said polymers especially at elevated temperatures.

One or more of these and/or other objects, features, or advantages of the present invention will become apparent from the specification and claims that follow. No single embodiment need provide each and every object, feature, or advantage. Different embodiments may have different objects, features, or advantages. Therefore, the present invention is not to be limited to or by an objects, features, or advantages stated herein.

BRIEF DESCRIPTION OF THE DRAWINGS

Illustrated embodiments of the disclosure are described in detail below with reference to the attached drawing figures, which are incorporated by reference herein.

DETAILED DESCRIPTION

Figure 1:
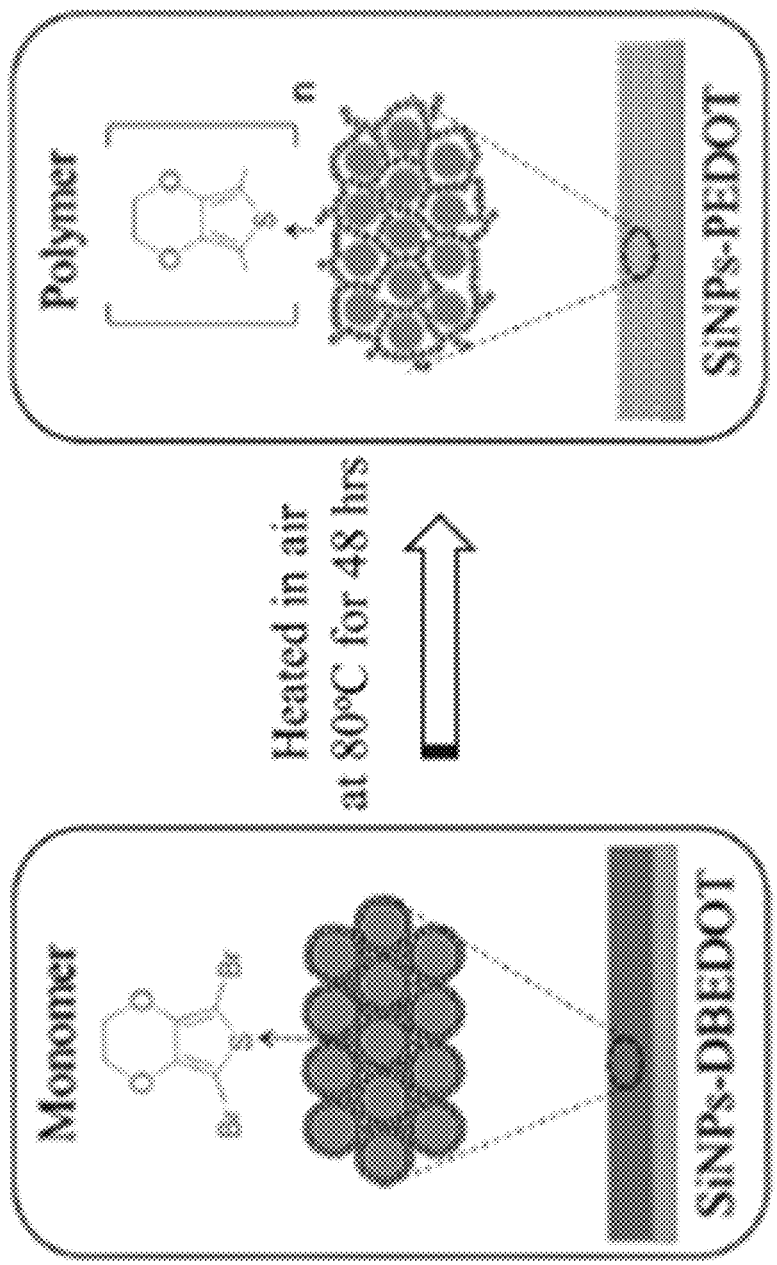
FIG. 1 is a pictorial representation of an exemplary one step in-situ thermal polymerization of SiNPs-DBEDOT on Cu substrate resulting in electrically conducting SiNPs-PEDOT polymer nanocomposite in accordance with an illustrative aspect of the present disclosure.

The present invention relates to a group of electrically conductive polymers, such as polyacetylenes, polypyrroles, polythiophenes, polyanilines, polyfluorenes, poly(3-hexyl-thiophene), polynaphthalenes, poly(p-phenylene sulphide), poly(para-phenylenevinylenes), poly(3,4-ethylenedioxy-thiophene), and their derivatives. Specifically, the present invention is related to the group of polythiophenes, such as poly(3,4-ethylenedioxythiophene) based polymer, known as PEDOT, which is a conducting polymer based on 3,4-ethylenedioxythiophene (EDOT) monomer.

The present invention further relates to the specific advantages for the synthesis of the PEDOT-based polymer nanocomposites from the corresponding halogenated monomers and the advantages for electrochemical or bioelectrochemical energy generation and storage devices.

Different from conventional practices in the field, the present invention relates to electrically conducting polymer nanocomposites produced from the group of polythiophenes in a one-step self-polymerization process from a haloginated ethylenedioxythiophene monomer or its derivatives resulting in a conjugated poly-3,4-ethylenedioxythiophene (PEDOT)-based nanocomposite polymers. More specifically, the present disclosure is related to 2,5-dibromo-3,4-ethylenedioxythiophene (DBEDOT) monomer or its derivatives.

The applications of the present invention described in the present disclosure are relevant, but are not limited to the electrochemical energy generation and storage devices and specifically the electrode materials of the devices; among them batteries, die-sensitized solar cells, fuel cells, supercapacitors, or combination thereof. Yet other application areas may also include touchscreens, organic light-emitting diodes, flexible organic solar cells, and organic electrochemical transistors. Furthermore, the disclosed PEDOT-based polymer films and nanocomposites can be used as hole-injecting transparent plastic and flexible electrodes for polymer light emitting diodes, field-effect transistors, and photovoltaic cells.

The applications of the present invention require high adhesion, mechanical, chemical, and electrochemical stability, and sufficient electrical conductivity that is provided by the disclosed invention, which is specifically focused on a one-step self-polymerization process of a nanocomposite material consisting of a sold-state phase and a halogenated 3,4-ethylenedioxythiophene (HEDOT) monomer or its derivatives. Specifically, a one-step self-polymerization process of a nanocomposite consisting of a solid-state phase and brominated 3,4-ethylenedioxythiophene, more specifically 2,5-dibromo-3,4-ethylenedioxythiophene (DBEDOT) monomer resulting in a conjugated poly(3,4-ethylenedioxythiophene) PEDOT is disclosed.

The corresponding nanocomposites used in the applications of the present invention comprise metals (e.g., noble and non-noble), metal alloys, metalloids, non-metals (e.g., boron and carbon), semi-conductors (e.g., silicon and their nanostructures of 1D/2D mateials), metal oxides, non-metal oxides, complex metal oxides, (e.g., perovskites, anti-perovskites, fluorites), zeolites, biomaterials, and the combination thereof which all benefit from the disclosed one-step self-polymerization of a halogenated-3,4-ethylenedioxythiophene monomer or its derivatives.

TECHNICAL BACKGROUND

Conductive polymers made from the precursor monomers or a mixture of monomers selected from thiophenes, pyrroles, anilines, and polycyclic aromatics are disclosed in various publications and patents (e.g., US 2008/0283800 and WO 2009097654). Among them, the poly-(3,4-ethylenedioxythiophene) (PEDOT) is one of the most promising conductive polymers, that offers several advantages, such as a binder and an electrically conducting phase. Furthermore, the known advantages include high electrical conductivity, electrochromic properties, and optical transparency combined with high chemical and electrochemical stability.

At least three conventional methods of PEDOT polymer synthesis currently exist, among them are the chemical method of oxidative polymerization, electrochemical method, and a heterocyclic coupling reaction of polymerization.

Oxidative polymerization is a conventional method for forming polythiophenes from their monomeric precursors. Specific organic peroxide compounds are known in the field as oxidizing agents for the preparation of polythiophenes by means of oxidative polymerization. US 20090310285 describes a method for preparing polythiophene dispersions by oxidative polymerization of a thiophene or thiophene derivative, wherein an oxidizing agent is used and the process results in formation of a conductive polythiophene with a specific conductivity in the range of 10-2-10-3 Scm-1. A higher value of specific conductivity for a polythiophene, specifically 350 Scm-1 (103Ω surface resistance) is disclosed in the U.S. Pat. No. 5,035,926.

It is important to note, that the polythiophenes produced in the process of oxidative polymerization contain the polyanions that are not electronically conductive, which is a significant disadvantage for energy generation and storage devices. To compensate for the positive charge on the polymer thiophene chain and to stabilize the polymer matrix, the polyanions possess high molecular weights in the range of 2,000-500,000. Thus, the polyanions are considered as a "dead weight" for not being involved in the electronic charge transfer process. Furthermore, the inorganic peroxide compounds although suitable as oxidizing and polymerizing agents (e.g., hydrogen peroxide, sodium perborate, persulfates etc.) are chemically aggressive and often non-compatible with the procedures required for the preparation of the various electrochemically active nanocomposites or nano-coatings. Lastly, the oxidative polymerization of the EDOT (e.g., with FeCl3 in organic solvents) produces an insoluble black polymer powders, that cannot be transposed into a film.

Electropolymerization is another conventional method that has many disadvantages. The EDOT monomer electropolymerization is generally performed in an organic media because of the low solubility of the thiophene-based monomers in water, high oxidation potentials of thiophenes (higher than that of water), and water-catalyzed formation of thienyl cation radicals. Electropolymerization in the organic solvents is a time-consuming and complicated approach which is not suitable for many industrial applications. Electrochemical polymerization of 3,4-ethylenedioxythiophene (EDOT) in sodium poly(styrene-4-sulfonate) (NaPSS) aqueous solution can produce electrode-supported and freestanding films of electroactive PEDOT; however, the amount of monomer left after the reaction is complete makes this method problematic for industrial applications.

According to EP 1079397, the PEDOT polymer can be used in combination with polystyrene sulfonate (PSS) forming a polymer mixture of two ionomers poly(3,4-ethylenedioxythiophene) and polystyrene sulfonate (PEDOT:PSS). Instead of polystyrene sulfonate polyanion, other anions (e.g. tetramethacrylate (TMA), para-toluenesulfonate (PTS), etc.) can be used in combination with PEDOT forming, for example PEDOT:TMA and PEDOT:PTS. However, these charged macromolecules in which positive charge on PEDOT compensates for the negative charge on the polymer anion require multiple process steps and cannot be formed in the disclosed one-step polymerization process.

In the PEDOT:PSS polymer mixture, the nature of the electronic conductivity is based on the transport of the charge carriers along the PEDOT conjugated chains. The initial conductivity of PEDOT:PSS (0.008 S/cm) in 3D network is significantly decreased by PSS, but can be improved up to 10 S/cm by using the secondary dopant, e.g., diethylene glycol. However, in electrochemical devices diethylene glycol impedes the electrode performance due to the chemical decomposition and dissolution.

Numerous patent disclosures describe applications of PEDOT:PSS for solar cells (e.g., WO 2015025333), supercapacitors (e.g., CN 103361698), lithium-ion batteries (e.g., EP 2619827; WO 2014026112) and electrochemical cells (e.g., EP 2250693). However, contrary to monomeric precursors, the PEDOT:PSS polymer mixture applied to the substrate surface as a dispersion of PEDOT:PSS macromolecules in water does not have an ability for the "in-situ" self-polymerization, since it is already polymerized. For example, in the case of liquid crystal displays (LCDs) and solar cells, radical cationic polymerization of PEDOT with ammonium persulfate as an initiator involves multiple steps and requires additional steps for stabilization with a polyanion.

US20050070654 invention relates to the use of conductive organic polymers in the production of pixellated electroluminescent devices, such as organic light emitting diodes and thin film field effect transistor electrodes. These materials can be prepared by polymerizing dioxythiophene monomers in aqueous solution in the presence of a water soluble poly-styrenesulfonic acid (U.S. Pat. No. 5,300,575), but the process involves multiple steps.

Claimed in EP 2250693 is the PEDOT polymer film on a Goretex substrate. In this process, a plasma-enhanced deposition of a poly-toluenesulfonic (PTS) acid on one side of the Goretex substrate is performed, followed by a vapor phase polymerization (VPP) of the EDOT monomer in presence of an oxidant (e.g. iron para-toluenesulfonate, Fe(III)PTS) in a 40% solution in butanol to the other side of the Goretex substrate in a plasma chamber. This procedure was followed by washing out the excess of the PTS anion and Fe(II) with ethanol from the PEDOT-Gortex electrode for a Zn-air battery. From this description it is clear that this complicated multi-step approach produces PEDOT:PTS, similar to PEDOT:PSS as disclosed in the other referenced patents.

Disclosed in CN 105074947 is a multi-step process of preparing a layered organic photovoltaic cell comprised of an electrically conductive polymer. The electrically conductive polymer is a cationic polythiophene with a PSS counterion forming a non-polar PEDOT:PSS film.

In addition to the emphasized above disadvantages of the PEDOT:PSS mixture, the presence of PSS makes this mixture thermally unstable due to disintegration of the ionic bonds between PEDOT and PSS. Better alignment of negatively charged PSS chains than PEDOT oligomers initiates the PEDOT:PSS mixture aging in which 50% of the PEDOT:PSS resistance loss takes place after 47 h of the PEDOT:PSS exposure to 120° C. at ambient conditions.

Two patents, specifically U.S. Pat. No. 7,579,112 and US20100233538 disclose methods for preparation of battery electrodes, e.g., using PEDOT:PSS/Poytetrafluoroethylene (PTFE) encapsulation. Since the nature of the PEDOT:PSS mixture is polymeric, the "in-situ" polymerization on the surface of the working electrode cannot be performed. Thus, application of PEDOT:PSS results in an inhomogeneous distribution of the phases at nanoscale, less adhesion between the polymer matrix and the electrode active material, and higher contact resistance at the interface between them.

The PEDOT:PSS nanocomposites are conventionally known in the art and have been used in the cathodes of the lithium-ion batteries (U.S. Pat. No. 7,579,112) in combination with cathode active material lithium manganese cobalt oxide (LMCO) as an active phase. The LMCO particles were encapsulated using a mixture of 90 wt. % PTFE and 10 wt. % PEDOT-PSS. In this approach, the multiple steps required to produce the disclosed battery cathode are considered as a disadvantage.

To increase the electronic conductivity, carbon is commonly added to the electrode nanocomposites since the binder phase represented by the adhesive polymers, such as polyvinylidene difluoride (PVDF) and polyacrylic acid (PAA), is not electrically conductive. Electrically conducting polymers, such as PEDOT:PSS are conventionally known, but their deposition on the electrode substrate consists of either multiple steps or cannot be performed in one-step "in-situ" polymerization.

Poly(ethylenedioxythiophene) (PEDOT) as Polymer Electrode in Redox Supercapacitor by Rue et al. and Further Evidence for Spontaneous Solid-State Polymerization Reactions in 2,5-dibromothiophene Derivatives by Spencer et al. describe a heterocyclic coupling reaction of halogenated polythiophenes. Both Rue and Spencer fail to disclose validation of the polymerization processes in presence of the solid state nanoparticles that do not affect the process of the heterocyclic coupling.

Therefore, what is needed is "in-situ" formation of a polymer nanocomposite from halogenated thiophene monomers as a one-step polymerization process. In the present invention, the properties of the nanocomposites produced from HEDOT monomer, specifically DBEDOT (FIG. 1), for preparation of the polymer-based nanocomposites in a one-step process are demonstrated for the first time.

Exemplary Aspects of the Present Invention

Examples of a one-step "in-situ" polymerization method for making electrically conductive polymer nanocomposites from the halogenated, and more specifically brominated EDOT monomer 2,5-dibromo-3,4-ethylenedioxythiophene are disclosed. In this regard, various approaches validate that polymer nanocomposites can be deposited on metal supports playing the role of anode or cathode current collectors. Furthermore, it validates, that the nanocomposite films of the present invention can be produced in a one-step thermally initiated process in absence of catalysts or initiators and without additional steps for removal of the reaction by-products.

Example 1: Methods of Preparation of the PEDOT-Based Films and Nanocomposites from Halogenated EDOT In this example, the "in-situ" self-polymerization of a polymer nanocomposite comprising a solid-state phase and a PEDOT polymer formed from the DBEDOT monomer is disclosed. At least one type of synthesis consists of mixing the DBEDOT and the solid-state phase in an organic solvent and its exposure to the elevated temperatures in the range of 50-90° C. and preferably 70-80° C. in a one-step self-polymerization process. The example includes silicon nanoparticles used as a solid-state phase. However, other 1D/2D based nanostructures conventional known in the art can be used for this purpose, such as metals, metal alloys, metal oxides, nonmetals, ceramics, semiconductors, non-metal oxides and combination thereof.

For preparation of a PEDOT-based polymer nanocomposite, the initial monomer solution was made by dissolving 0.1 g DBEDOT (Sigma Aldrich) in acetonitrile (Sigma Aldrich), followed by 2 hours of stirring and 15 min of sonication. Then, 0.1 g SiNPs (US Research Nanomaterials Inc.) were added to the monomer solution, stirred for 2 hours and sonicated for 15 min. The SiNPs-DBEDOT slurry was deposited onto an etched copper foil serving as an anode substrate by using a doctor blade. The deposited layer was dried overnight in air and heated at 80° C. for 48 hours in vacuum for the "in-situ" thermal polymerization.

In an "ex-situ approach", 0.1 g of SiNP was added to the suspension of the pre-polymerized pure PEDOT powder in acetonitrile followed by 2 hours of stirring and 15 min of sonication. The slurry was deposited onto an etched copper foil using the same method as in the case of "in-situ" deposition and dried overnight in air.

To confirm that DBEDOT polymerization is not affected by the presence of solid-state phase, specifically the silicon nanoparticles used in this example, 0.1 g DBEDOT in acetonitrile was prepared and dried overnight without exposure to elevated temperature. Then, another sample of pure PEDOT polymer was prepared (for a direct comparison) by heating it at 80° C. for 48 hours in vacuum.

Figure 2:
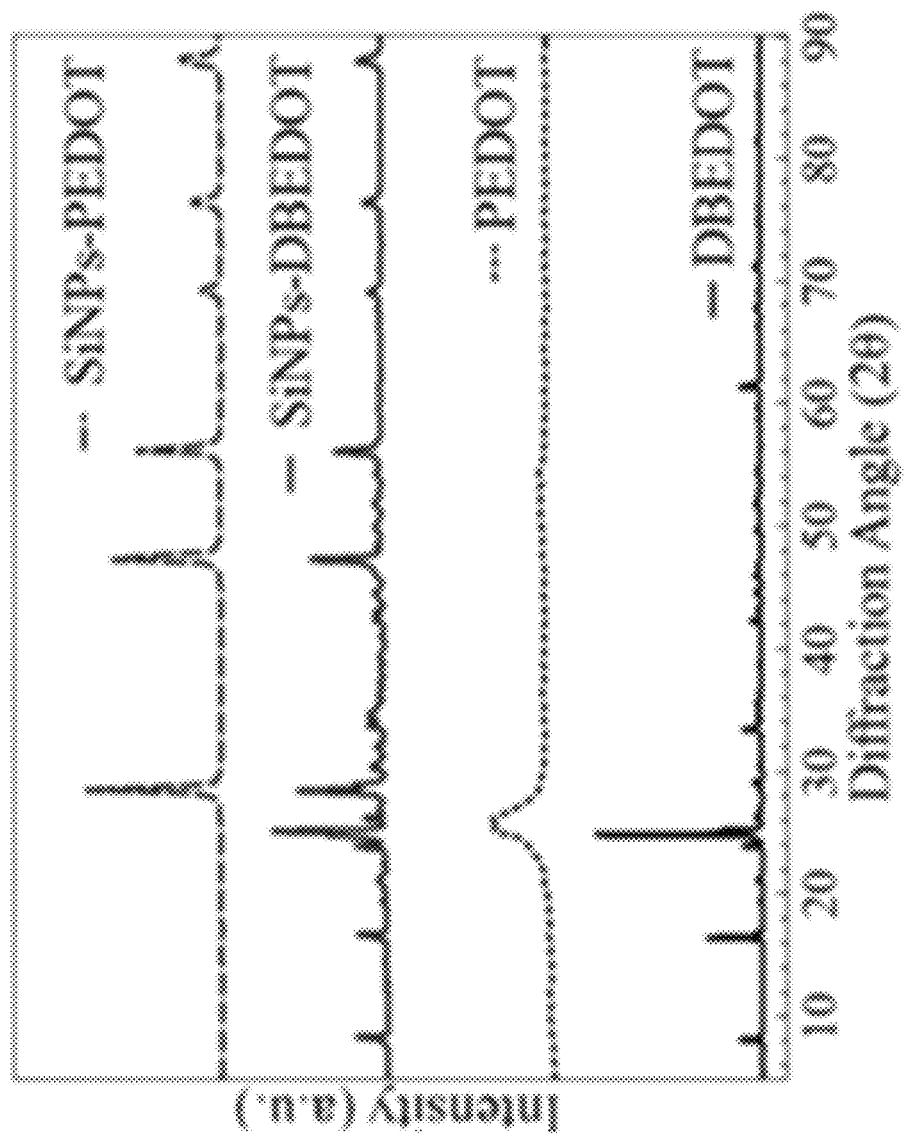
FIG. 2 is a plot comparison of X-ray diffraction of a thermally polymerized DBEDOT monomer into a PEDOT conducting polymer and "in-situ" polymerization of SiNPs-DBEDOT into SiNPs-PEDOT nanocomposite in accordance with an illustrative embodiment.

Example 2: Confirmation of the "In-Situ" Polymerization of the PEDOT-Based Nanocomposite from the Halogenated EDOT by XRD The X-ray diffraction (XRD) of the polymerized nanocomposite with 50 wt. % SiNPs and 50 wt. % PEDOT formed from the DBEDOT monomer has been compared to a 50 wt. % SiNPs and 50 wt. % pure DBEDOT mixture, and a pure DBEDOT film before and after polymerization (see FIG. 2). The XRD analysis demonstrates that the pure DBEDOT monomer, before polymerization, possesses a crystal structure with the characteristic peaks at $2\theta=8.14°$, $16.48°$, and $24.88°$. After thermally induced polymerization, the PEDOT polymer is formed in an almost completely amorphous phase, showing a single broad peak at $2\theta=25.12°$ (see FIG. 2, black dotted line) most likely due to residual bromine complexed to sulfide groups in the form of $Br_3-$. However, the XRD spectrum of the produced 50 wt % SiNPs-50 wt % PEDOT nanocomposite does not have any peaks associated with the PEDOT polymer. Conversely, only the peaks related to the crystalline silicon nanoparticles are present. This example confirms that DBEDOT mixed with a solid-state phase can indeed undergo "in-situ" polymeriztion in presence of 50 wt. % solid-state phase, specifically silicon nanoparticles.

Example 3: FTIR Analysis of the PEDOT-Based Films from the Halogenated EDOT

Figure 3:
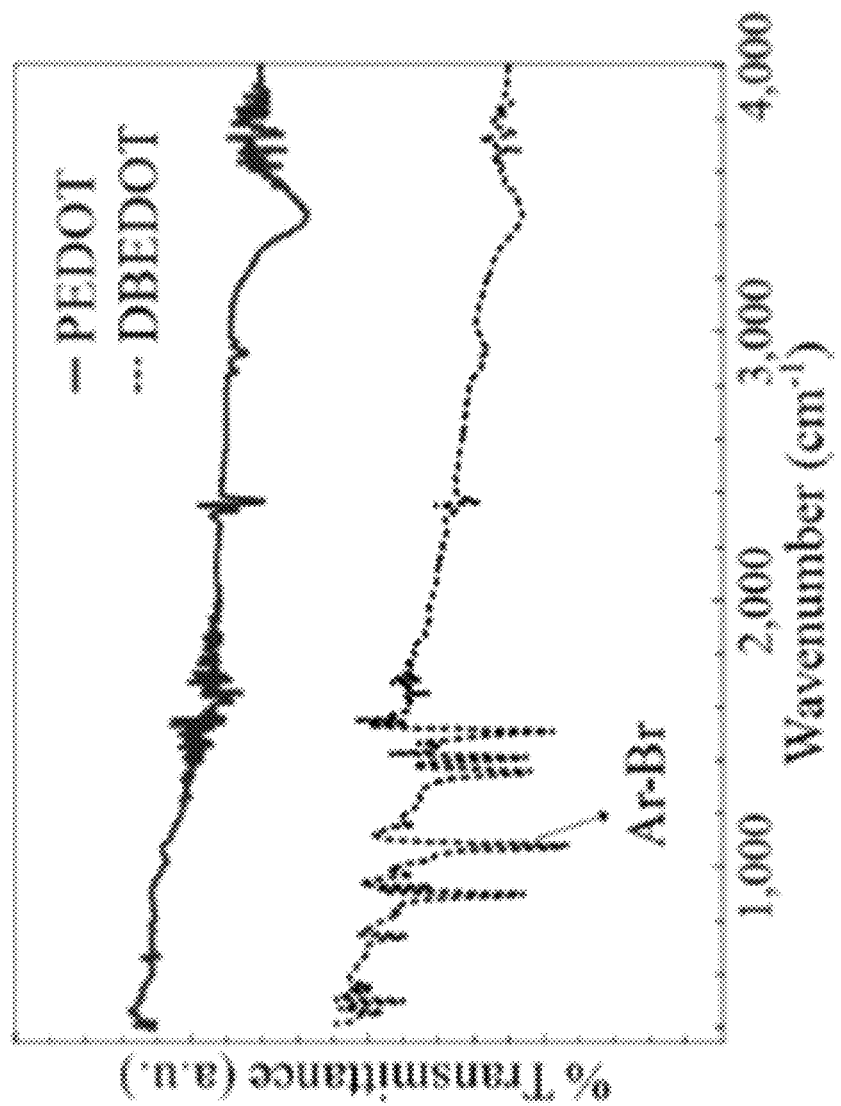
FIG. 3 is a plot of FT-IR spectra of DBEDOT and PEDOT in accordance with an illustrative embodiment.

In this example, the "in-situ" self-polymerization of a PEDOT polymer is formed from the corresponding DBEDOT monomer in a thermally initiated heterocyclic coupling reaction, as well as its optical transparency important for the optical devices and the solar cells. The DBEDOT monomer FTIR spectroscopy was performed on the DBEDOT monomer before and after polymerization (see FIG. 3). The peaks for the DBEDOT monomer reveal several functional groups present in the fingerprint region, among them the peak at 1082 $cm^{-1}$ representing an aromatic C—Br bond. After the thermally induced polymerization of the DBEDOT monomer, the FTIR spectrum shows that the peaks are not visible due to the lack of the inherent transmittance relevant to the formed PEDOT polymer. Complete disappearance of the C—Br peak, suggests that the gaseous by-product bromine has been able to completely evolve at the given elevated temperature (specifically 80° C.) in vacuum and that the DBEDOT polymerization was complete.

Figure 4:
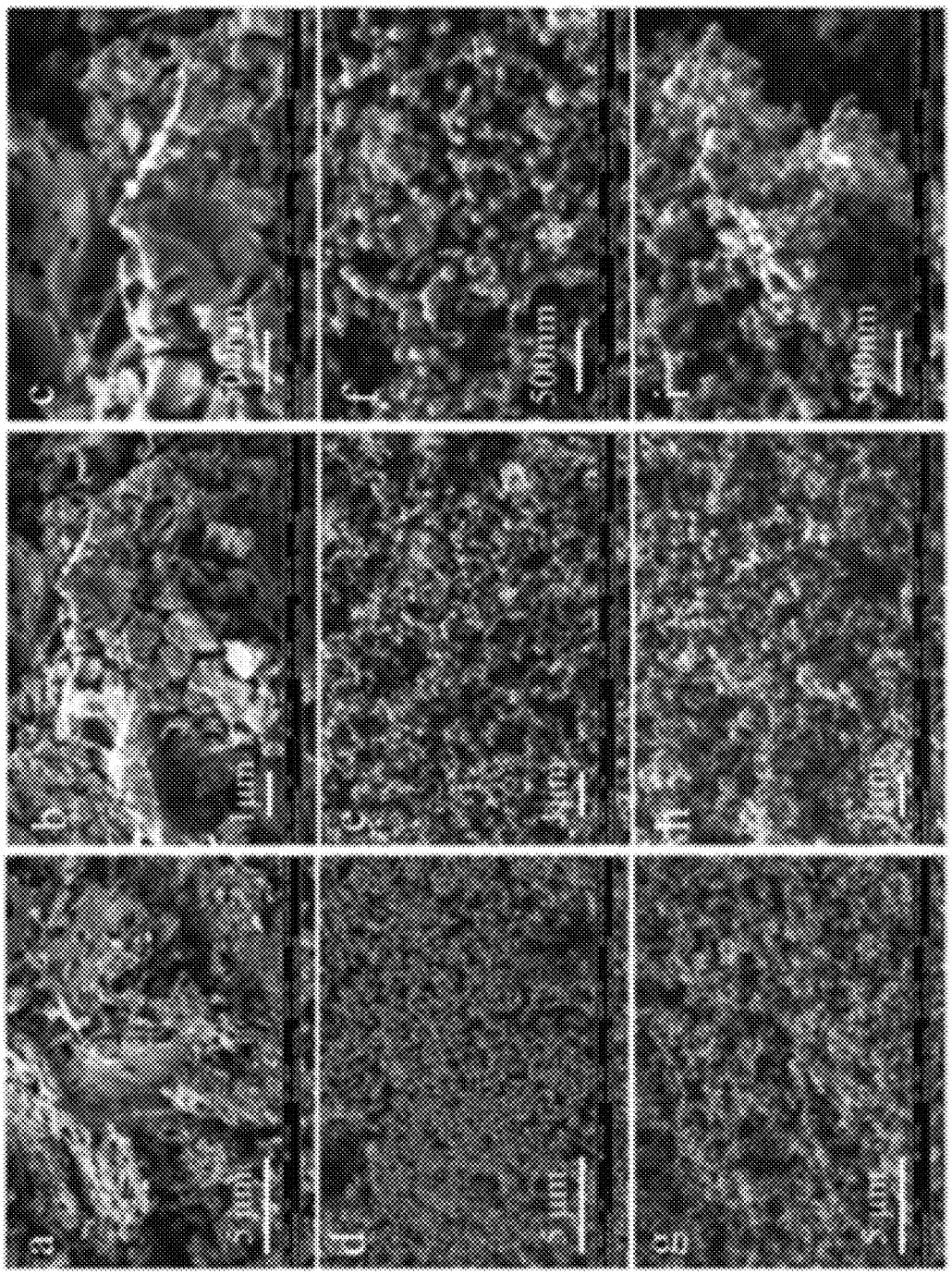
FIG. 4 is a pictorial representation comparing morphological changes by SEM analysis of the pure PEDOT polymer (aec) and the SiNPs-PEDOT nanocomposites polymerized by ex-situ (def) and in-situ (gei) methods at three different magnifications in accordance with an illustrative aspect of the present disclosure.

Example 4: SEM Analysis of the PEDOT-Based Nanocomposites Made from the Halogenated EDOT The SEM images (see FIG. 4) taken by a Supra 40VP (Zeiss) field emission scanning electron microscope at 1 kV electron beam accelerating potential provide the morphological differences at three different magnifications of the pure PEDOT polymer (a-c) and the SiNPs-PEDOT nanocomposites polymerized by "ex-situ" (d-f) and "in-situ" (g-i) methods. The SEM analysis of the pure PEDOT polymer particles formed from a self-polymerized DBEDOT (see FIG. 4(a)-(c)), demonstrates that the particles of ~1-2 μm size, whereas SiNPs-PEDOT nanocomposite polymerized "ex-situ" (see FIG. 4(d)-(f)) or "in-situ" (FIG. 4(g)-(i)) show significant differences at microscale. Specifically, the "in-situ" polymerized SiNPs-PEDOT nanocomposite shows a porous structure with well distributed submicron SiNPs embedded in the nanofibrous PEDOT matrix. However, the submicron PEDOT particles in a separate phase similar to the pure PEDOT (FIG. 3(a)-(c)) can be seen only in "ex-situ" polymerized SiNPs-PEDOT composite. This observation indicates the advantage of the "in-situ" polymerization for achieving a porous and uniformly well-dispersed SiNPs phase throughout the PEDOT matrix.

Figure 5:
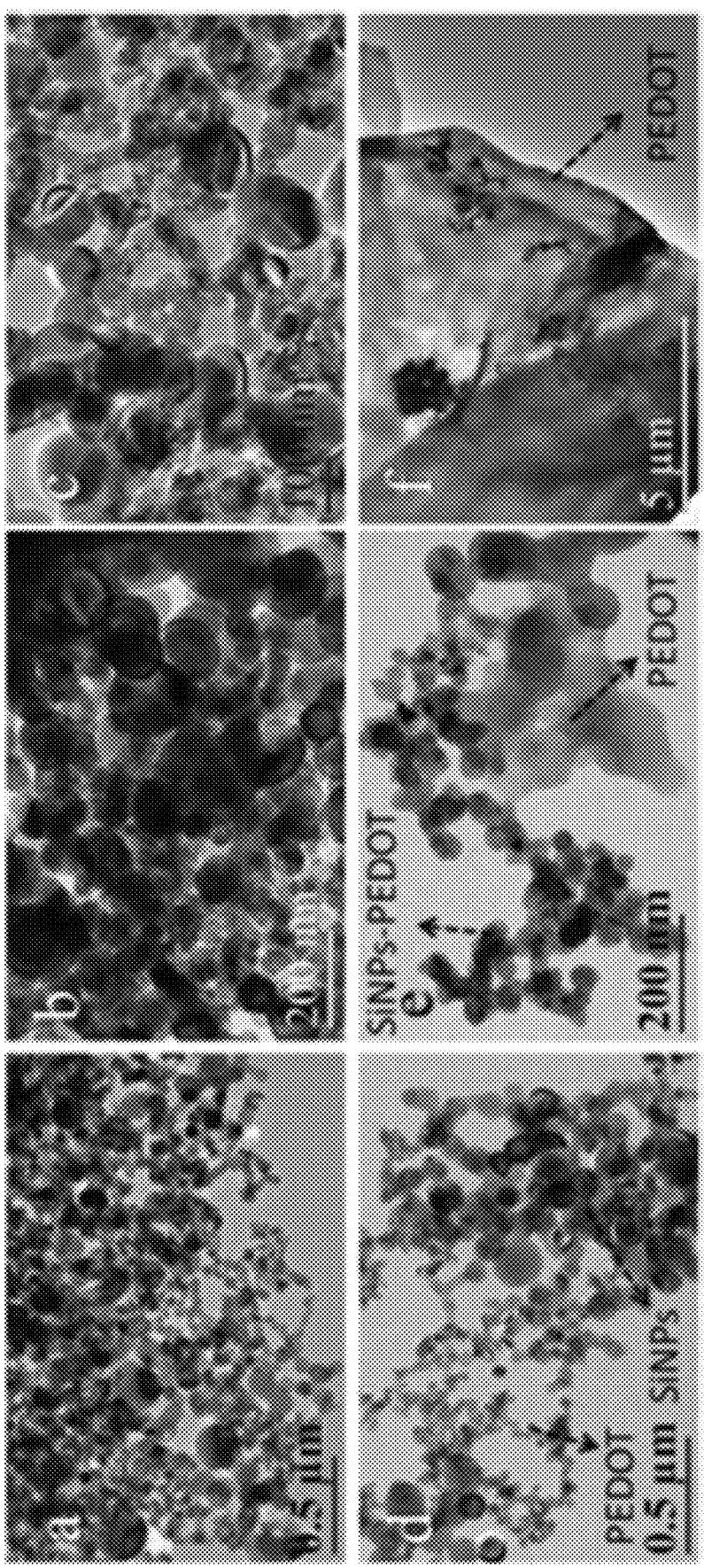
FIG. 5 is a pictorial representation of the morphological differences at nanoscale observations for the SiNPs-PEDOT composites polymerized by using in-situ (a-c) or ex-situ (d-f) approaches in accordance with an illustrative aspect of the present disclosure.

Example 5: The Benefits of the "In-Situ" Halogenated EDOT Polymerization Revealed by the TEM Analysis The differences in the internal nanoscale morphology of the SiNPs-PEDOT nanocomposites polymerized by "in-situ" or "ex-situ" were identified by the TEM analysis (see FIG. 5) using a high-resolution JEOL TEM-2100 HRTEM with an electron beam emitting from $LaB_6$ gun under the beam energy of 200 keV. Before the TEM analysis, the nanocomposites were dispersed in methanol by sonication and placed on a square-mesh copper grid coated with carbon (CF200-Cu).

In case of "in-situ" polymerization, the SiNPs are clearly in direct contact with the PEDOT polymer matrix. This is achieved by encapsulation of the SiNPs within the 3D-nanofibrous network of the PEDOT polymer (see FIG. 5(a)-(c)). In the case of "ex-situ" polymerization (see FIG. 5(d)-(f)), only a partial contact of SiNPs phase with the PEDOT matrix is achieved. Specifically, the absence of the SiNPs within some of the PEDOT agglomerates is observed that illustrates the intermittent nature of the "ex-situ" polymer phase, similar to the traditional carbon-based composites.

Example 6: Benefits of an "In-Situ" PEDOT Self-Polymerization from DBEDOT Revealed by Cyclic Voltammetry The cyclic voltammetry (CV) measurements with the PEDOT nanocomposite prepared from DBEDOT, as described in Example 1, were performed in a half-cell configuration with lithium-foil as a counter and a reference electrode by scanning from an open circuit voltage to 0.05 V, and then consecutively cycling between 0.05 V and 1.00 V for 20 cycles.

Figure 6:
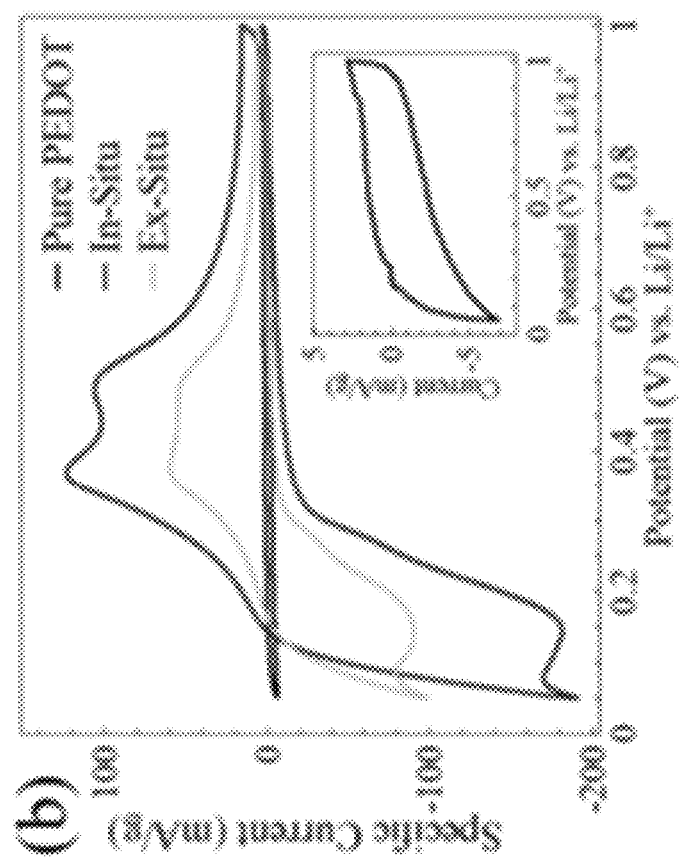
FIG. 6 is a plot of the CV comparison of the PEDOT polymer with the SiNPs-PEDOT nanocomposites formed by in-situ or ex-situ methods in accordance with an illustrative aspect of the present disclosure.
Figure 6:
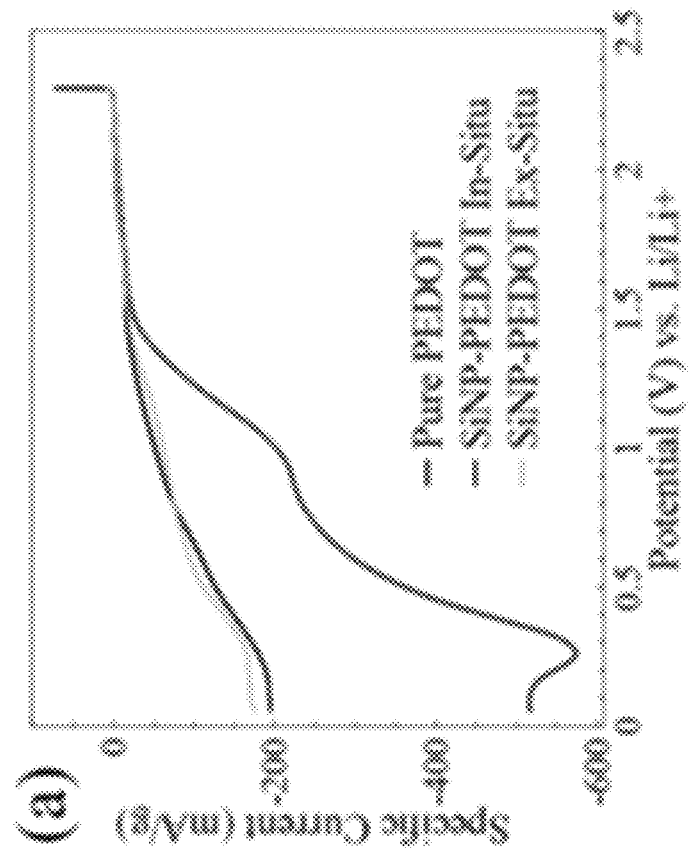
Figure 7:
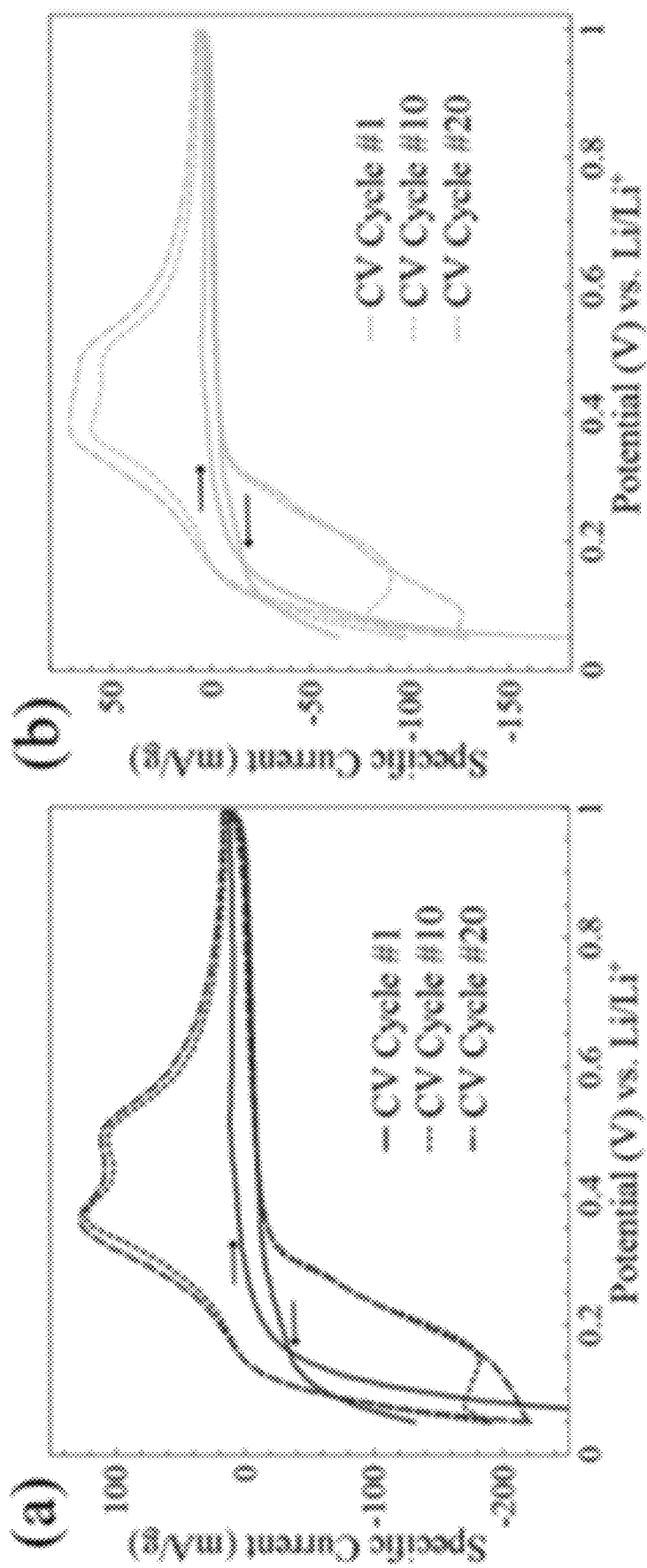
FIG. 7 is a plot of the CV comparison of the SiNPs-PEDOT nanocomposites polymerized by in-situ and ex-situ methods in accordance with an illustrative aspect of the present disclosure.

The comparison of the CV plots of the pure PEDOT polymer and the SiNPs-PEDOT nanocomposites (see Example 1) synthesized by "in-situ" and "ex-situ" methods is presented in FIGS. 6 and 7. The initial cathodic scan from the open circuit voltage to 0.05 V vs. Li/Li+ shows (see FIG. 6(a)) that the SEI formation starts for all three cells at 1.5 V. High specific current for the "in-situ" SiNP-PEDOT nanocomposite electrodes can be seen when compared to pure PEDOT and "ex-situ" synthesized electrodes. The absence of the delithiation peak suggests that this current is the response to the irreversible side-reaction which is expected to be the polymerization of residual DBEDOT monomer induced by the formation of LiBr. The high specific currents observed in case of the "in-situ" polymerized SiNPs-PEDOT nanocomposite is explained by more effective adhesion and high electrochemical surface area, thus resulting in a greater SEI layer formation in the first cathodic scan. By the tenth CV cycle (see FIG. 6(b)), it is apparent that the pure PEDOT electrodes do not exhibit redox behavior, but only pseudocapacitance.

A comparison of the "in-situ" and "ex-situ" electrochemical cells with SiNP-PEDOT nanocomposite on the working electrode reveals the superior lithiation-delithiation behavior in case of the "in-situ" polymerized electrodes. This could be due to the high electrochemical surface accessibility for the conduction of both electrons and Li+ ions provided by the PEDOT polymer network produced from the halogenated EDOT. The comparison of the subsequent CV cycles of "in-situ" and "ex-situ" polymerized SiNP-PEDOT electrodes (see FIG. 7) revealed a typical silicon lithiation-delithiation behavior with the cathodic and anodic peaks, respectively. Besides the superiority of the "in-situ" polymerized SiNPs-PEDOT anode in regard to the specific current, the silicon phase delithiation peaks of the "in-situ" electrodes compared to that of "ex-situ" electrodes are sharper and more discrete, suggesting better kinetics due to high electron and Li+ transport within the in-situ SiNPs-PEDOT nanocomposite. The analysis of the anodic and cathodic peaks reveals that by the end of the tenth cycle, the "in-situ" polymerized electrodes are operating at much higher currents that stabilized by the 20th cycle compared to the "ex-situ" electrodes. This observation suggests that there is almost twice as much silicon phase participating in the lithiation process within the in-situ polymerized electrodes. The effect can be explained by the more effective activation of the silicon nanoparticles in the lithiation/delithiation process as a result of considerably larger electrochemical active surface area of the interface between SiNPs and PEDOT, as revealed by the TEM analysis (See Example 2).

Figure 8:
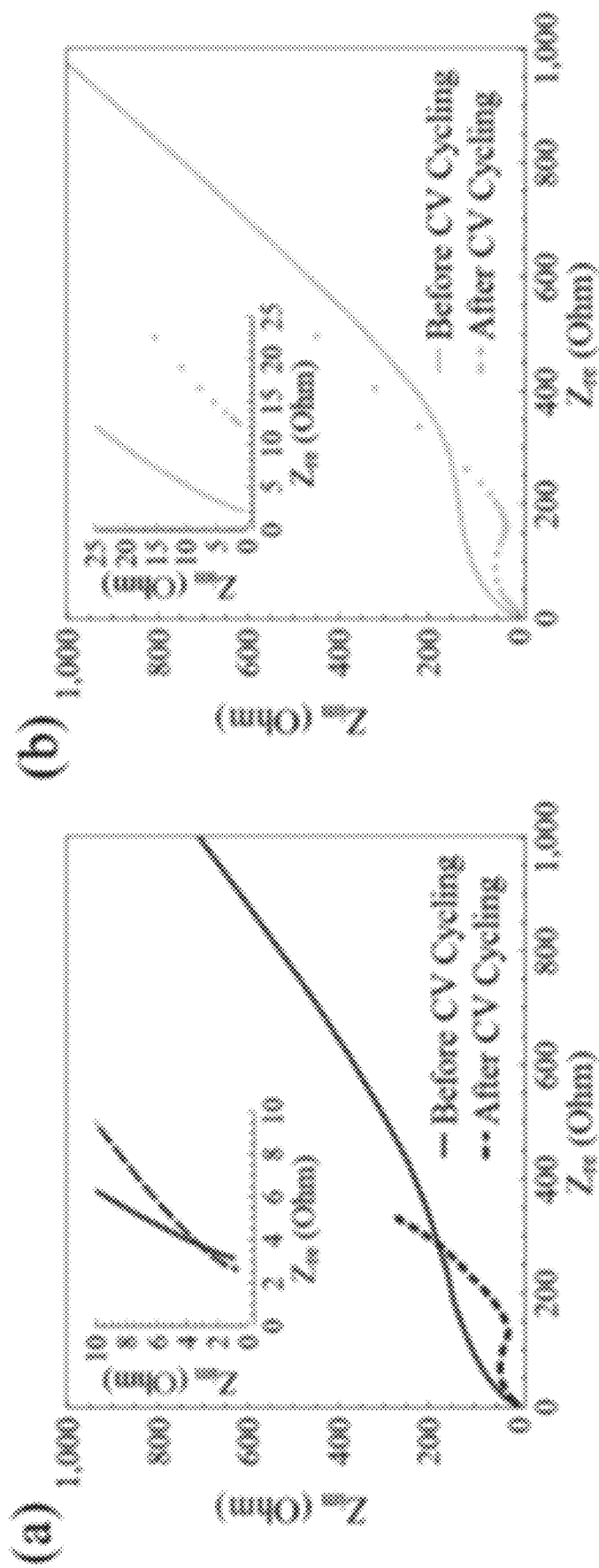
FIG. 8 is a plot of the comparison of the Nyquist plots for in-situ and ex-situ polymerized SiNPs-PEDOT nanocomposites before and after 50 CV cycles in accordance with an illustrative aspect of the present disclosure.
Figure 9:
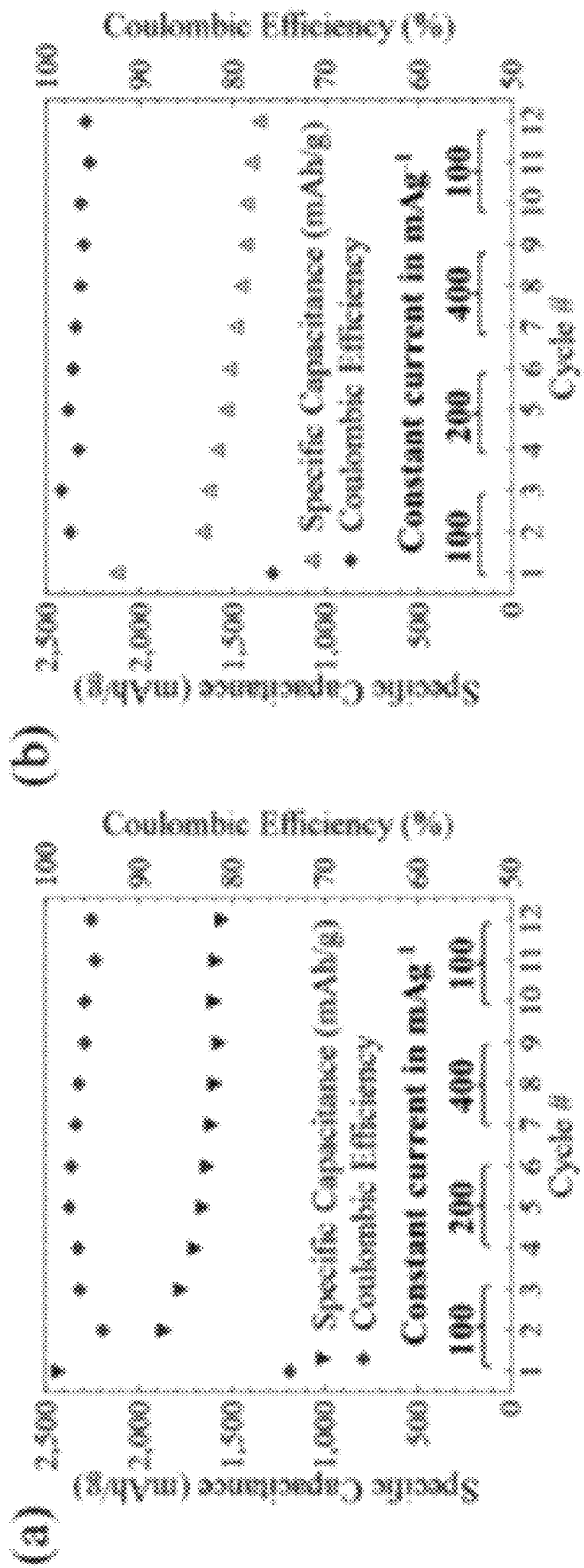
FIG. 9 is a plot of the formation cycles at different charge-discharge rates for in-situ and ex-situ polymerized SiNPs-PEDOT nanocomposites between 0.05 and 1.0 V versus Li/Lib in accordance with an illustrative aspect of the present disclosure.
Figure 10:
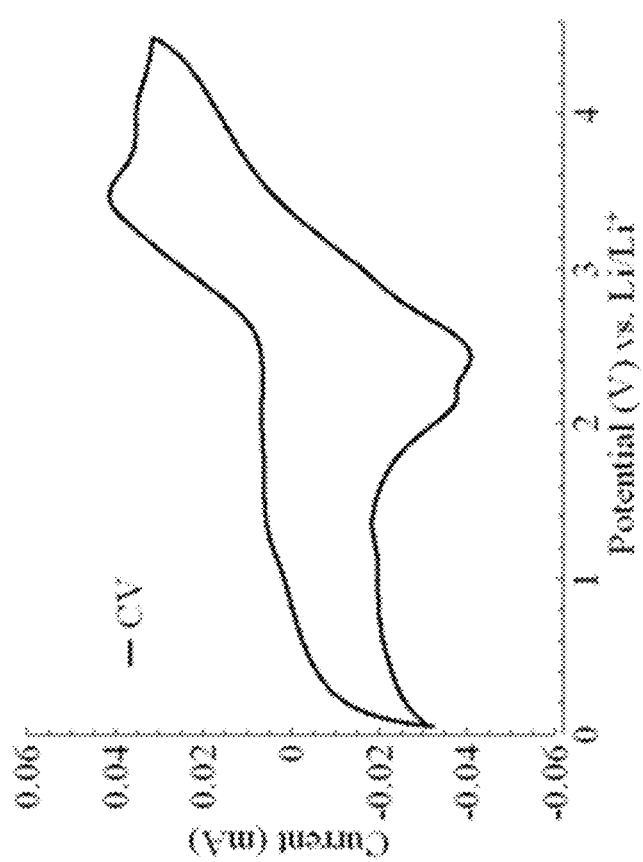
FIG. 10 is a plot of the cyclic voltammetry (CV) of PEDOT/Li half-cell between 0.05 to 4.5 V at a scan rate of 0.001 V/sec in accordance with an illustrative aspect of the present disclosure.

Example 7: Benefits of an "In-Situ" PEDOT Self-Polymerization from Halogenated EDOT Revealed by Impedance Spectroscopy The impedance spectroscopy data with the PEDOT-based nanocomposites prepared from the DBEDOT monomer and SiNPs, as described in Example 1, was obtained by scanning the CR2025 half-cell with a LiPF6-based liquid electrolyte in the frequency range of 10 mHz-200 kHz. The AC impedance plots for the "in-situ" and "ex-situ" polymerized SiNPs-PEDOT nanocomposites were studied before and after 50 consecutive CV cycles (see FIG. 8). In the case of "ex-situ" polymerized SiNPs-PEDOT nanocomposites, the internal resistance increased to 12 Ohm after 50 cycles. The observed increase is explained by the deposition of an SEI layer on the surface of the working electrode, which usually takes place in silicon-based electrodes. Conversely, the internal resistance of the "in-situ" polymerized electrodes decreased after 50 cycles, suggesting that "in-situ" polymerized PEDOT helps to control the growth of the SEI layer. One possible explanation is that the PEDOT polymer coating produced by thermal polymerization of the DBEDOT monomer controls the outward growth of the α-$Li_xSi$ particles during the lithiation. In the case of the "ex-situ" polymerized cells, the uncoated silicon is allowed to grow freely each cycle exposing new silicon surface to the electrolyte for potential SEI growth. Conversely, the "in-situ" electrodes have a benefit of a thin PEDOT polymer coating which controls the outward growth, limiting the amount of new Si surface exposed to the electrolyte. Furthermore, it is assumed that the PEDOT polymer doping with the LiPF6 electrolyte has yet another benefit by increasing the conductivity of the PEDOT polymer and decreasing the internal resistance. In the case, if the residual DBEDOT could be found in the cells prior to cycling, it can be polymerized to completion by a pseudo Grignard reaction induced by the formation of LiBr that would in turn decrease the internal electrochemical cell resistance.

Example 8: Benefits of an "In-Situ" PEDOT Self-Polymerization from the Halogenated EDOT Revealed by Galvanostatic Charge/Discharge Cycling The PEDOT nanocomposites prepared from the DBEDOT monomer as described in Example 1, were exposed to galvanostatic charge/discharge cycling in a CR2023 half-cell assembly between 0.05 V and 1.00 V at the specific currents equal to 100 $mAg^{-1}$ for 3 cycles, 200 $mAg^{-1}$ for 3 cycles, 400 $mAg^{-1}$ for three cycles, and 100 $mAg^{-1}$ for the last 3 cycles. The Coulombic efficiency in the first cycle is slightly lower for "in-situ" polymerized anodes presumably due to the lithium consumption during the process of residual polymerization. Both cells display a moderate decrease in specific capacitance between each cycle. This is caused by the formation of an insulating SEI layer, which increases the over-potential needed to induce the delithiation. As a result, a certain percentage of lithium atoms is trapped within the silicon phase in each cycle that irreversibly lowers the capacitance. The observed behavior of both SiNP-PEDOT nanocomposite systems indicate that while minor amounts of specific capacitance are lost between each cycle, this amount seems to be independent of the changes in current, meaning that within these current ranges no kinetic barrier has been reached making current irrelevant of specific capacitance. This can be a result of the balanced electronic and ionic conductivity of PEDOT in contact with liquid electrolyte. The final specific capacitances for the "in-situ" and "ex-situ" polymerized anodes with 50 wt. %-50 wt. % of the PEDOT and SiNPs are 1550 and 1355 mA·h/g, respectively, which is in correlation with the theoretical specific capacitance of the bulk silicon (4000 mA·h/g). A higher capacitance of the "in-situ" cells is the result of their superior lithium ion and electron transport kinetics due to the higher degree of PEDOT polymer homogeneity, intercalation, and ionic-electronic conductivity.

Example 9: Electrochemical Stability in the Cathode PEDOT-Based Nanocomposite at High Voltages The pure PEDOT nanocomposite prepared from DBEDOT as described in Example 1, has been tested for Li-ion battery cathode in CR2023 coin half-cell assembly with a Celgard polyethylene membrane (25 mm thick) as a separator. The electrochemical stability of the PEDOT nanocomposite prepared from DBEDOT was verified by studying the redox behavior within the electrochemical window of 0.05-4.5 V. The CV plot of PEDOT/Li half-cell shows two redox peaks at 3.42 V and 4.05 V in the anodic scan and at 2.47 V and 2.17 V in the cathodic scan, respectively. The two-phase redox transition of PEDOT could be arising from n-doping/de-doping corresponding to intercalation/de-intercalation reaction of Li+-ion into the PEDOT matrix as shown in the following equation:

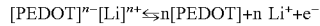

$$[PEDOT]^{n-}[Li]^{n+} \leftrightharpoons n[PEDOT] + n\ Li^+ + e^-$$

Therefore, it can be concluded that PEDOT can be used as a conducting polymer binder in the cathode nanocomposite due to its electrochemical stability, specific capacity contribution combined with $Li^+$-ion and electronic conductivity.

Specific Aspects of the Present Invention

The disclosed self-polymerization of the PEDOT-based nanocomposites by means of thermal initiation is specifically demonstrated for 2,5-dibromo-3,4-ethylenedioxythiophene (DBEDOT). This process has an advantage of an "in-situ" one-step polymerization, high adhesion of the polymerized nanocomposite to the substrate or/and the surface of the solid-state phase nanoparticles, uniform distribution of the solid phase within the polymer matrix, and uniform coating of the said solid nanoparticles. The beneficial outcomes of the disclosed self-polymerization of the PEDOT-based nanocomposites comprise high percolation of the active solid state phase and the polymer matrix. Furthermore, the said outcomes provide the means of the one-step polymerization of the nanocomposites and the absence of the additional steps for removal of the reaction by-products pertinent, which can be applied in, but not limited to batteries, electrolyzers, supercapacitors, fuel cells, or optically transparent devices.

The PEDOT polymer nanocomposite matrix formed by the "in-situ" polymerization minimizes the negative effect of the volume expansion of the active solid phase (e.g., nanoparticles) by controlling the outward growth of the macrostructure (e.g., during charge/discharge cycles in lithium-ion batteries), thus maintaining the electronic and ionic pathways in case of an individual nanoparticle fracture.

According to at least one aspect of the present invention, the halogenated EDOT monomer or its derivatives can be used for preparation of the polymer nanocomposite films by suspending the solid-state nanoparticles in a brominated EDOT monomer organic mixture which is homogeneously dispersed around the surface of the said nanoparticles forming an electrically conducting polymer matrix. In this process the polymer PEDOT chains are formed in the self-polymerization process around the nanoparticles. As a result, the said process provides a continuous conducting and binding polymer network that links each particle to the adjacent particle and results in high percolation.

According to another aspect of the present invention, the high voltage window of the nanocomposite based on the PEDOT polymer produced from the halogenated EDOT monomers or its derivatives mixed with a solid-state phase. It is further demonstrated herein that the disclosed PEDOT-based nanocomposites operate up to at least 4.5 V and thus can be used in the high-voltage cathodes providing safe and reliable lithium-ion battery electrochemical performance.

As previously disclosed herein, poor solubility of the corresponding EDOT monomers in aqueous solutions is a known disadvantage of the PEDOT electrochemical polymerization process. This disadvantage has been only partially circumvented in the oxidative polymerization processes forming PEDOT polymers doped with polyanions (e.g., PSS, TMA, etc.). The disclosed polymerization of the nanocomposites using the halogenated EDOT monomer or its derivatives eliminates the problem of low water solubility, since the said halogenated monomer EDOT, specifically DBEDOT, undergoes natural polymerization in the temperature range of 50–90° C., and preferably 70-80° C. without involvement of initiators, catalysts, or electrochemical polymerization. This advantage of the "in-situ" one-step self-polymerization of the DBEDOT monomer in presence of solid-state particles is demonstrated in the disclosure for the first time.

The invention is not to be limited to the particular embodiments described herein. In particular, the invention contemplates numerous variations in PEDOT electrochemical polymerization. The foregoing description has been presented for purposes of illustration and description. It is not intended to be an exhaustive list or limit any of the invention to the precise forms disclosed. It is contemplated that other alternatives or exemplary aspects are considered included in the invention. The description is merely examples of embodiments, processes or methods of the invention. It is understood that any other modifications, substitutions, and/or additions can be made, which are within the intended spirit and scope of the invention.

What is claimed is:

1. An electrochemical polymerization method, comprising:
    forming an ionic-electrically conducting nanocomposite from a halogenated 3,4-ethylenedioxythiophene (EDOT) or EDOT derivatives mixed with a polar aprotic solvent and solid-state phase 1D or 2D nanostructures using "in-situ" self-polymerization.

2. The method of claim 1, wherein the electrically conducting nanocomposite is a conducting and self-polymerized 3D nanocomposite matrix.

3. The method of claim 1, wherein the electrically conducting nanocomposite is formed from 2,5-dibromo-3,4-ethylenedioxythiophene (DBEDOT) or DBEDOT derivative.

4. The method of claim 1, wherein the self polymerization is a one-step polymerization process.

5. The method of claim 1, wherein the polar aprotic solvent is an organic solvent.

6. The method of claim 1, wherein the halogenated monomer EDOT forms a homogeneous solution with an organic solvent in presence of a solid-state phase introduced to the solution in the form of solid-state nanoparticles.

7. The method of claim 1, wherein an organic solvent in the presence of the halogenated monomer EDOT mixed with the solid-state nanostructures evaporates during the self-organized polymerization process resulting in formation of a solid-state nanocomposite.

8. The method of claim 3, further comprising:
removing gaseous products from the forming electrically conducting nanocomposite thereby naturally forming the solid-state nanocomposite.

9. The method of claim 2, further comprising:
processing the nanocomposites without cleaning or separation processes.

10. The method of claim 1, further comprising:
thermally initiating self-polymerization of the nanocomposite in a temperature range from 50° C. to 90° C.

11. The method of claim 1, wherein a time period for self-polymerization of the nanocomposite ranges based on a weight percent of the solid-state phase and film thickness.

12. The method of claim 1, further comprising:
forming a 3D nanocomposite from the halogenated EDOT monomer or EDOT derivatives with one or more catalytically or non-catalytically active metal- or non-metal-based solid-state phases in the form of a nanoparticle.

13. The method of claim 1, wherein the nanostructures comprise carbon, silicon, a metal, a metal alloy, a metal oxide, a ceramic, a semiconductor, or combination thereof.

14. The method of claim 1, wherein the nanostructures comprise nanotubes or nanorods.

15. The method of claim 1, further comprising:
forming electrodes from the self-polymerizing nanocomposites, wherein an electrochemical storage cell, fuel cell, electrolyzer, supercapacitor includes one or more of the electrodes.

16. The method of claim 1, further comprising:
controlling optical transparency of the self-polymerizing nanocomposites for producing optically transparent nanocomposites, wherein a solar cell, photovoltaic cell include the optically transparent nanocomposites.

17. The method of claim 1, wherein an electrical stability of the self-polymerizing nanocomposites has a voltage range from 0.05 to 4.5 V.

* * * * *